United States Patent [19]
Hung

[11] Patent Number: 5,963,477
[45] Date of Patent: Oct. 5, 1999

[54] FLASH EPROM ERASE ALGORITHM WITH WORDLINE LEVEL RETRY

[75] Inventor: Chun-Hsiung Hung, Hsin-Chu, Taiwan

[73] Assignee: Macronix International Co., Ltd., Hsinchu, Taiwan

[21] Appl. No.: 08/987,217

[22] Filed: Dec. 9, 1997

[51] Int. Cl.$^6$ .............................. G11C 7/00; G11C 16/00
[52] U.S. Cl. .................... 365/185.22; 365/185.11; 365/185.23; 365/185.29; 365/201; 365/218; 365/230.03; 365/230.06
[58] Field of Search .............................. 365/218, 185.22, 365/185.29, 185.11, 230.03, 201, 185.23, 230.06

[56] References Cited

U.S. PATENT DOCUMENTS 4,875,188  10/1989  Jungroth .............................. 365/185.22
5,414,664   5/1995  Lin et al. ................................. 365/218

Primary Examiner—Do Hyun Yoo
Attorney, Agent, or Firm—Haynes & Beffel LLP

[57] ABSTRACT

Methods and systems for floating gate memory cell array erasure with wordline level retry are disclosed. A data storage device includes a memory array organized into a plurality of blocks of memory cells, each of the blocks including a plurality of wordlines of memory cells. An energizing circuit applies energizing voltages to the memory cells to read and program addressed cells, and to erase selected blocks of memory cells, or the whole memory array. An erase verify circuit separately verifies erasure of the individual wordlines that compose each block that is erased. The control logic can include a plurality of shared wordline erase flags which correspond to respective wordlines in each particular block as they are verified. If the wordline passes erase verify, then the wordline erase flag is reset. Only those wordlines having a set wordline erase flag after the erase verify operation are re-erased. To support this operation, the circuit includes the capability of erasing only a single wordline of the memory array at a time. The invention provides the advantages of higher speed of erasure and enhanced protection against over erasure.

23 Claims, 9 Drawing Sheets

FLASH EPROM ERASE ALGORITHM WITH WORDLINE LEVEL RETRY

BACKGROUND OF THE INVENTION

1. Field of the Invention

The present invention relates to the design and operation of erasable and programmable non-volatile memory devices. More particularly, the present invention relates to circuits and algorithms for erasing memory cells in FLASH EPROM devices with wordline level retry.

2. Description of Related Art

Non-volatile memory design based on integrated circuit technology represents an expanding field. One popular class of non-volatile memory cell is known as the erasable-programmable read only memory (EPROM). Two popular EPROM designs are distinguished in the manner in which isolation of the memory cells is carried out. The first member of this class is referred to as the EEPROM. The second member of this class is known as the FLASH EPROM which uses a higher density format.

Both the FLASH EPROM and EEPROM technologies are based on a memory cell which consists of a source, channel, and drain with a floating gate over the channel and a control gate isolated from the floating gate. The act of programming the cell involves charging the floating gate with electrons which causes the turn-on threshold of the memory cell to increase. Thus, when programmed the cell, will not turn on (i.e., it will remain non-conductive, when addressed with a read potential applied to its control gate). The act of erasing the cell involves removing electrons from the floating gate to lower the threshold. With the lower threshold, the cell will turn on to a conductive state when addressed with a read potential to the control gate.

Both the FLASH EPROM and EEPROM memory cells suffer from the problem of over-erasure. Over-erasure occurs if, during the erasing step, too many electrons are removed from the floating gate leaving a slight positive charge. This biases the memory cell slightly on, so that a small current may leak through the memory cell even when it is not addressed. A number of over-erased cells along a given bitline can cause an accumulation of leakage current sufficient to cause a false reading. The regular EEPROM design uses either a two transistor cell structure which includes a pass gate that isolates the memory cell from the bitline or a split-gate structure which behaves like two transistors in series to isolate unselected cells, so that unselected memory cells do not contribute leakage current to the bitline. The higher density FLASH EPROM cell does not use the isolation transistor or split-gate, so over-erasure causes a significant problem in the FLASH EPROM design.

When floating gate cells are over-erased, it makes it difficult to reprogram the cells successfully using hot electron programming, particularly with embedded algorithms in the integrated circuits that cannot handle special cases.

In the past, commercial FLASH EPROM designs have included circuitry for verifying the success of programming and erasing steps. See, for instance, U.S. Pat. No. 4,875,188, entitled VOLTAGE MARGINING CIRCUIT FOR FLASH EPROM, invented by Jungroth.

Traditionally, erase verification begins at address 0000 (hex) and continues through the array to the last address, or until data other than FF (hex) is encountered. If a byte fails to verify, the entire device is re-erased. This re-erase operation may result in over-erasure of memory cells that had passed the erase verify voltage margin during the initial erase operation. Also, the re-erase operation is time consuming, requiring re-verification of the entire array after each re-erase operation.

To address these problems, FLASH EPROM designs have been developed to include circuitry for programming, erasing, verifying, re-erasing, and re-verifying at a memory level smaller than the entire array. In these designs the memory array is divided into a plurality of sectors (blocks), each of which composes an erase retry unit. See U.S. Pat. No. 5,414,664 entitled FLASH EPROM WITH BLOCK ERASE FLAGS FOR OVER-ERASE PROTECTION, invented by Lin et al., the entire contents of which are hereby incorporated by reference.

Meanwhile, low power design parameters and high speed read requirements continue to exert a strong motivation to lower the erase voltage (ERS-VT) that is used to erase the memory cells. However, the lower most boundary of the ERS-VT is limited by the over-erase and the soft program current issues. As a result, the VT distribution control is becoming more and more crucial. What is needed, therefore, is a better way to control the ERS-VT.

The ERS-VT could be better controlled by design if only a small unit of to-be-erased FLASH EPROM memory cells exposed to the next erase high voltage pulses. Even in sector divided memory arrays, the erase retry unit is traditionally large (e.g., 512 Kb).

Accordingly, an erase verify and re-erase system for FLASH EPROM devices is needed which provides enhanced protection against over-erase due to repeated erasures, and which further speeds up the verify sequence.

SUMMARY OF THE INVENTION

The present invention provides a FLASH EPROM device which comprises a memory array organized into a plurality of blocks of memory cells. An energizing circuit applies energizing voltages to the blocks of memory cells to read and program addressed cells, and to erase the memory array. An erase verify circuit separately verifies erasure of blocks in the plurality of block memory cells. Control logic controls the energizing circuit to re-erase blocks which fail erase verify.

The control logic includes a plurality of block erase flags which correspond to respective blocks of memory cells in the array. The erase verify is responsive to the block erase flags to verify only those blocks having a set block erase flag. If the block passes erase verify, then the block erase flag is reset. Only those blocks having a set block erase flag after the erase verify operation are re-erased. To support this operation, the circuit also includes the capability of erasing only a block or multiple blocks of the memory array at a time.

Thus, a flag is associated with each block in the memory array to indicate the erase status of each of the block. If the flag is on or set, then for that particular block identified by the most significant bits in the address, the block is erased and then erase verify operations go through every address by counting through the least significant bits of the address inside the block. If the flag is off for that block, then the internal state machine skips the block without erasing or erase verify.

An object of the invention is to provide an algorithm which allows a 1 WL (wordline, (e.g., 2 Kb)) erase retry unit.

The block erase flags are set at the beginning of the erase mode by the user. The user is able to select from one to the complete number of blocks on the chip.

Accordingly, an integrated circuit memory is provided with an embedded erase operation which is responsive to a command supplied to the chip, to enter a block erase mode. During the first part of the algorithm, flags are set for selected blocks. Next, a pre-programming operation to equalize charge in the floating gates and program verify operations are carried out on the selected blocks only. After program verification for the selected blocks, an erase operation is executed on selected blocks in parallel. Then, erase verify is executed at the block level, resetting flags for blocks that have been successfully erased. After erase verify, the algorithm loops back to the erase stage and erases only those blocks which have not been successfully erased as indicated by the block erase flags.

Other aspects and advantages of the present invention can be seen upon review of the figures, the detailed description, and the claims which follow.

DETAILED DESCRIPTION

A detailed description of preferred embodiments of the present invention is provided below with reference to the figures. The wordline level retry approach of the invention increases erase speed while simultaneously providing enhanced protection against over erasure.

Figure 1:
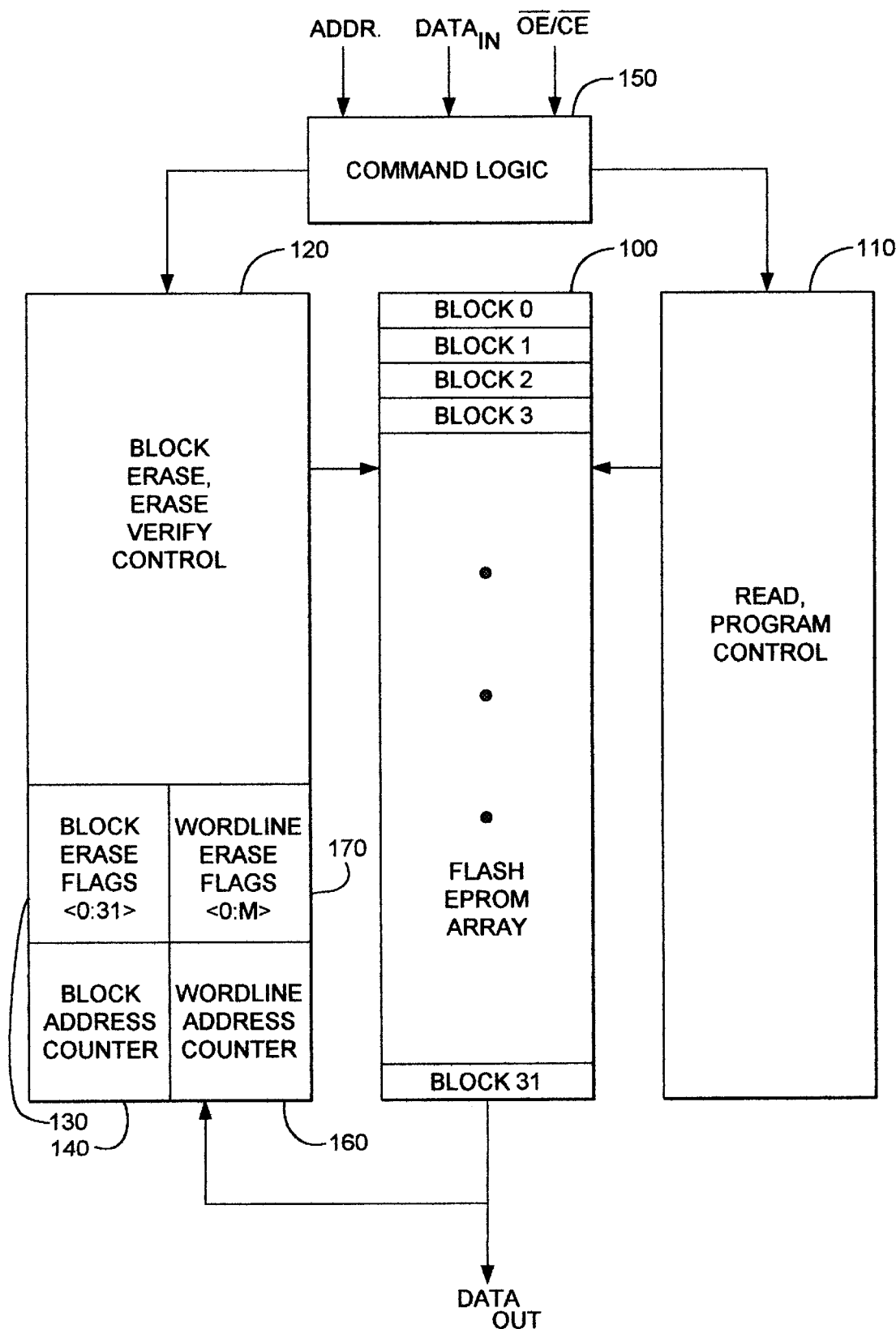
FIG. 1 illustrates a schematic block diagram providing an overview of an integrated circuit representing an embodiment of the present invention.

FIG. 1 shows the basic structure of a 4 megabit FLASH EPROM integrated circuit incorporating the present invention. The circuit includes a FLASH EPROM array, generally 100, which is divided into a plurality of blocks (32 blocks in the figure). The FLASH EPROM array has a segmentable architecture such as that shown in FIG. 2 described below.

Coupled with the array 100 are a read and program control circuit, generally 110, and a block erase and erase verify control circuit, generally 120. The block erase and erase verify control circuit 120 includes a plurality of block erase flags 130 and a block address counter 140 for incrementing through the blocks for the erase verify sequence. The block erase and erase verify control circuit 120 also includes a plurality of wordline erase flags 170 and a wordline address counter 160 for incrementing through the wordlines of array 100 during the erase verify sequence. The wordline erase flags 170 can be shared by the plurality of blocks.

The chip includes command logic 150 which is coupled to the address, data, and other control lines, such as the output enable and chip enable signals. The command logic 150 interprets inputs to set a mode of operation for the read and program control logic 110 and the block erase and erase verify control logic 120.

Command logic 150 may be implemented as done in standard FLASH EPROM integrated circuits, such as the Am28F020 flash memory chip manufactured by Advanced Micro Devices, Inc. of Sunnyvale, Calif., with the additional commands according to the present invention for block erase. In response to commands issued by the command logic 150, an embedded block erase operation is executed by one or more state machines in the block erase and erase verify control logic 120. The user, through a host CPU or otherwise, can supply address and data signals to the command logic 150 to indicate a preferred mode of operation. The modes relevant to the present invention include a chip erase mode in which all blocks in the array 100 are to be erased, and a block erase mode in which selected blocks in the array 100 are to be erased. Blocks to be erased are identified by the block erase flags 130. The wordline erase flags (0:M) 170 identify wordlines to be erased and will be discussed in more detail below.

Because of the architecture of the FLASH EPROM array 10, the blocks within the array are segmentable for the erase operation. An understanding of the array as shown in FIG. 2 demonstrates how the block erase operation may be executed by the control logic.

Figure 2:
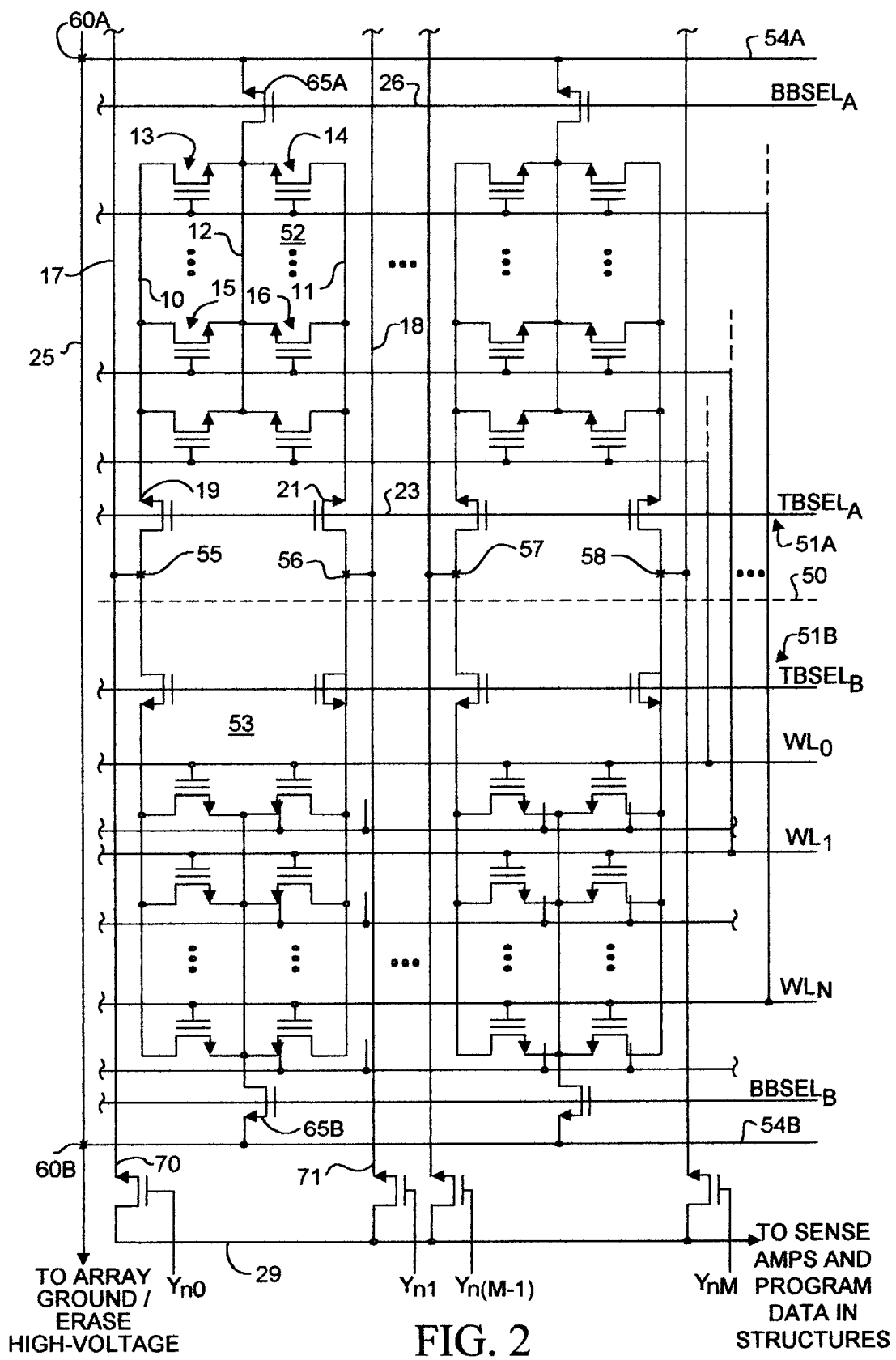
FIG. 2 illustrates an electrical schematic diagram of a segmented array architecture for a FLASH EPROM array representing an embodiment of the present invention.

FIG. 2 illustrates a segmentable array architecture, using a drain-source-drain configuration of the FLASH EPROM circuit, as described in U.S. Pat. No. 5,414,664. The circuit includes a first local bitline 10 and a second local bitline 11. The first and second local bitlines 10, 11 are implemented by buried diffusion conductors. Also included is a local virtual ground line 12 implemented by buried diffusion. A plurality of floating gate transistors having gates, drains and sources are coupled to the local bitlines 10, 11 and local virtual ground line 12. The sources of the plurality transistors are coupled to the local virtual ground line 12. The drains of a first column of transistors, generally 13, are coupled to the first local bitline 10, and the drains of a second column of transistors, generally 14, are coupled to the second local bitline 11. The gates of the floating gate transistors are coupled to wordlines $WL_0$ through $WL_N$, where each wordline (e.g., $WL_1$) is coupled to the gate of a transistor (e.g., transistor 15) in the first local bitline 10 and a transistor (e.g., transistor 16) in the second local bitline 11. Thus, transistors 15 and 16 can be considered a two transistor cell with a shared source diffusion.

The act of charging the floating gate is called the program step for the FLASH EPROM cell. This is accomplished on a byte by byte basis through hot electron injection by establishing a large positive voltage between the gate and the source, such as twelve volts, and a positive voltage between the drain and the source, such as six volts.

The act of discharging the floating gate is called the erase step for the FLASH EPROM cell. This is accomplished through F-N (Fowler-Nordheim) tunneling mechanism between the floating gate and the source (source erase) or between the floating gate and the substrate (channel erase). The source erasing is performed by applying a positive bias to the source, such as twelve volts or seven volts, while the gate is grounded or negatively biased, such as minus seven volts. The channel erasing on a block basis is performed by applying a negative bias to the gate and/or a positive bias to the substrate.

A first global bitline 17 and a second global bitline 18 are associated with each drain-source-drain block. The first global bitline 17 is coupled to the drain of top block select transistor 19 through a metal-to-diffusion contact 55. Similarly, the second global bitline 18 is coupled to the drain of top block select transistor 21 through a metal-to-diffusion contact 56. The sources of the top block select transistors 19, 21 are coupled to the first and second local bitlines 10 and 11, respectively. The gates of the top block selector transistors 19, 21 are controlled by a top block select signal $TBSEL_A$ on line 23.

The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. The gate of the bottom block select transistor 65A is controlled by a bottom block select signal $BBSEL_A$ across line 26. In the preferred system, the conductor 54A is a buried diffusion conductor which extends to a metal-to-diffusion contact 60A at a position displaced horizontally through the array, which provides contact to a vertical metal virtual ground bus 25.

The global bitlines extend vertically through the array to respective column select transistors 70, 71, through which a selected global bitline is coupled to sense amps and program data circuitry (not shown). Thus, the source of column select transistor 70 is coupled to global bitline 17, the gate of column select transistor 70 is coupled to a column decode signal $Y_{n0}$, and the drain of the column select transistor 70 is coupled to conductor 29.

The blocks of FLASH EPROM cells as shown in FIG. 1 are configured into a plurality of subarrays as illustrated in FIG. 2. FIG. 2 illustrates two subarrays within a larger integrated circuit. The subarrays are divided generally along dotted line 50 and include subarray 51A generally above the line 50 and subarray 51B generally below the line 50. A first group 52 of cells is laid out in a mirror image with a second group 53 of cells along a given bitline pair (e.g., bitlines 17, 18). As one proceeds up the bitline pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 25 through metal-to-diffusion contacts 60A, 60B. The subarrays repeat on opposite sides of the metal virtual ground line 25 so that adjacent subarrays share a metal virtual ground line 25. The metal virtual ground line 25 is coupled to array ground and erase high-voltage circuitry. Thus, the subarray layout requires two metal contact pitches per column of two transistor cells for the global bitlines and one metal contact pitch per subarray for the metal virtual ground line 25.

Furthermore, two or more subarrays as illustrated in FIG. 2 may share wordline signals as illustrated because of the additional decoding provided by the top and bottom block select signals $TBSEL_A$, $TBSEL_B$, $BBSEL_A$, and $BBSEL_B$. In the preferred system, each block is configured to include four subarrays in a column, a row in each subarray, sharing a common wordline drivers with rows in the other three subarrays. Decoding amongst the four subarrays is executed using the top block select transistors in response to TBSELA and TBSEL3. Each subarray includes 32 wordlines and 1K (1,024) bitlines. Thus, with four subarrays, 32 wordlines deep, and 1K bitlines wide, a block of 128K cells is provided. Thirty-two blocks makes a 4 megabit memory.

As can be seen, the architecture according to the present invention provides a sectored FLASH EPROM array. This is beneficial because the source and drain of transistors is non-selected subarrays during a read, program or erase cycle may be isolated from the currents and voltages on the bitlines and virtual ground lines. Thus, during a read operation, sensing is improved because leakage current from subarrays not selected does not contribute to current on the bitlines. During the erase operations, the high voltages of the virtual ground line are isolated from the unselected blocks by the BBSEL transistors. For blocks in the same sector, BBSEL has the same voltage level. BBSEL is driven with high voltage to pass array high voltage when the sector flag is set, and with zero volts when sector flag is reset. This allows a sectored erase operation.

Figure 3:
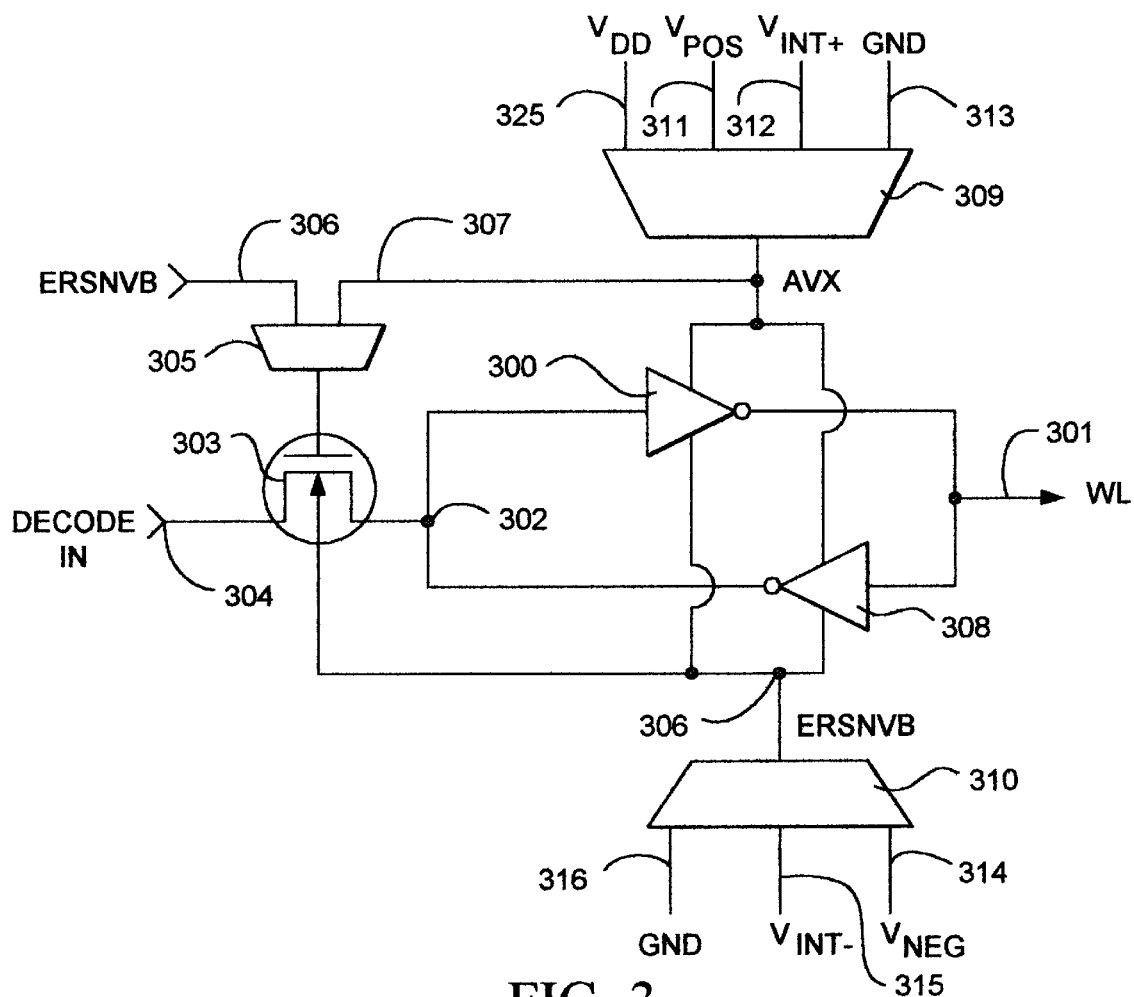
FIG. 3 illustrates an electrical schematic diagram of a wordline driver representing an embodiment of the present invention.

FIG. 3 provides a basic block diagram of the wordline driver according to the present invention. The wordline driver includes a driver circuit which is implemented with inverter 300 having its output connected to wordline 301 and its input connected to node 302, which receives a wordline select signal from a decoder through an isolation circuit composed of transistor 303 formed in an isolated p-well. Transistor 303 has its source connected to node 302 and its drain connected to the decode input 304. The gate of transistor 303 is connected to a selector 305 which supplies either the signal ERSNVB on line 306 or the signal AVX on line 307. The driver also includes circuitry for holding the value of the wordline select signal at node 302 when the isolation transistor 303 is nonconducting. This circuit consists of inverter 308 which has its input connected to the wordline 301, and its output connected to node 302. Thus, the combination of inverters 300 and 308 form a storage element.

The power supply voltages AVX and ERSNVB are supplied through power supply selector circuitry 309 and 310, respectively. Although not shown, the selectors 309 and 310 are shared by a plurality of wordline drivers.

The selector 309 supplies a signal AVX on line 307 from among positive supply voltage $V_{DD}$ on line 325, a high positive voltage $V_{POS}$ on line 311, one or more intermediate positive voltages $V_{INT+}$ on line 312, and ground on line 313, which provides a reference potential. The selector 310 selects from among a negative potential $V_{NEG}$ on line 314, one or more intermediate negative voltages $V_{INT-}$ on line 315, and ground on line 316.

The inverter 300 operates to select either the value AVX for connection to the wordline 301, or the value ERSNVB for connection to the wordline 301 depending on the value of the wordline select signal from the decoder on line 304. A more detailed description of the implementation of the driver is described below with reference to FIG. 5. The selectors 309, 310, and 305 are operated to establish a program mode, a read mode, and an erase mode under control of a mode control state machine on the chip.

During the program mode, the selector 309 is operated to supply the high positive potential $V_{POS}$ to line 307 as the signal AVX. The selector 310 is operated to supply ground to line 306 as the signal ERSNVB. The selected wordline (i.e. wordlines in a sector to be programed during the program mode) are charged to a +12 volts ($V_{POS}$) in the example described, while wordlines not selected are coupled to ground.

During the read mode, selector 309 is operated to supply the value $V_{DD}$ as the signal AVX, and the selector 310 is operated to supply ground.

During the erase mode, according to the present invention, the selector 309 is operated to supply ground as the signal AVX, and the selector 310 is operated to supply the signal $V_{NEG}$ as the signal ERSNVB on line 306. There is also an intermediate mode during which the selectors 309 and 310 are operated to select the signals $V_{INT+}$ and $V_{INT-}$ during a transition from a read mode to an erase mode, as explained in more detail below.

The selector 305 is operated to supply the signal AVX to a gate of transistor 303 during the read and program modes, to leave transistor 303 in a conducting state. During the erase mode, the signal ERSNVB on line 306 is applied to the gate. This is guaranteed to be as low as or lower than the value on node 302, turning off transistor 303, and isolating node 302 from the decoder.

Figure 4:
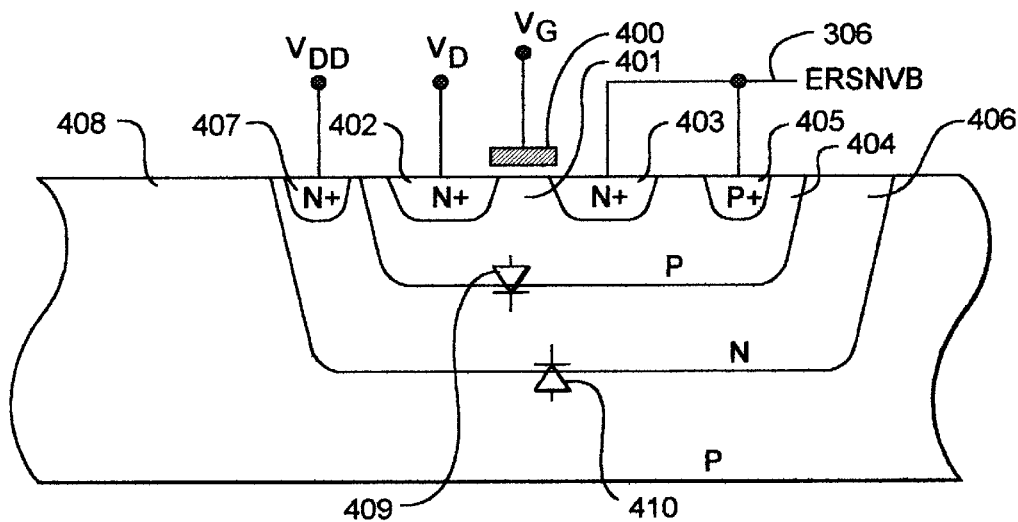
FIG. 4: illustrates a schematic view of an isolated n-channel transistor which is used in the wordline driver of FIG. 3.

The inverters 300 and 308 are composed of a p-channel transistor in series with an n-channel transistor. The n-channel transistor for both inverters is implemented in an isolated p-well, like transistor 303. The structure for this type of n-channel transistor is illustrated in FIG. 4. In particular, the transistor is composed of a gate terminal 400 over a channel region 401 which is formed between n-type diffusion regions 402 and 403 operating as the drain and source, respectively, of the transistor. The n-type diffusion regions 402 and 403 are implemented in the isolated p-type well 404. The p-type well has a contact at point 405 which is connected to the ERSNVB value on line 306. The source terminal 403 may or may not be connected to the line 306, depending on the particular application of the transistor. For instance, transistor 303 is not so connected.

The p-type well 404 is, in turn, formed in an n-type well 406, which has contact 407 to a positive supply voltage $V_{DD}$. The n-type well 406 is, in turn, formed in a p-type substrate 408. The structure establishes a p-n junction, schematically represented by the diode symbol 409 between the p-well 404, this junction is reversed biased, isolating the n-well from the negative voltage. Similarly, a p-n junction represented by the diode symbol 410 is formed between the p-type substrate and the n-well 406. By biasing the n-well 406 with a positive voltage, this junction 410 is reversed biased, isolating the entire structure from the substrate.

Figure 5:
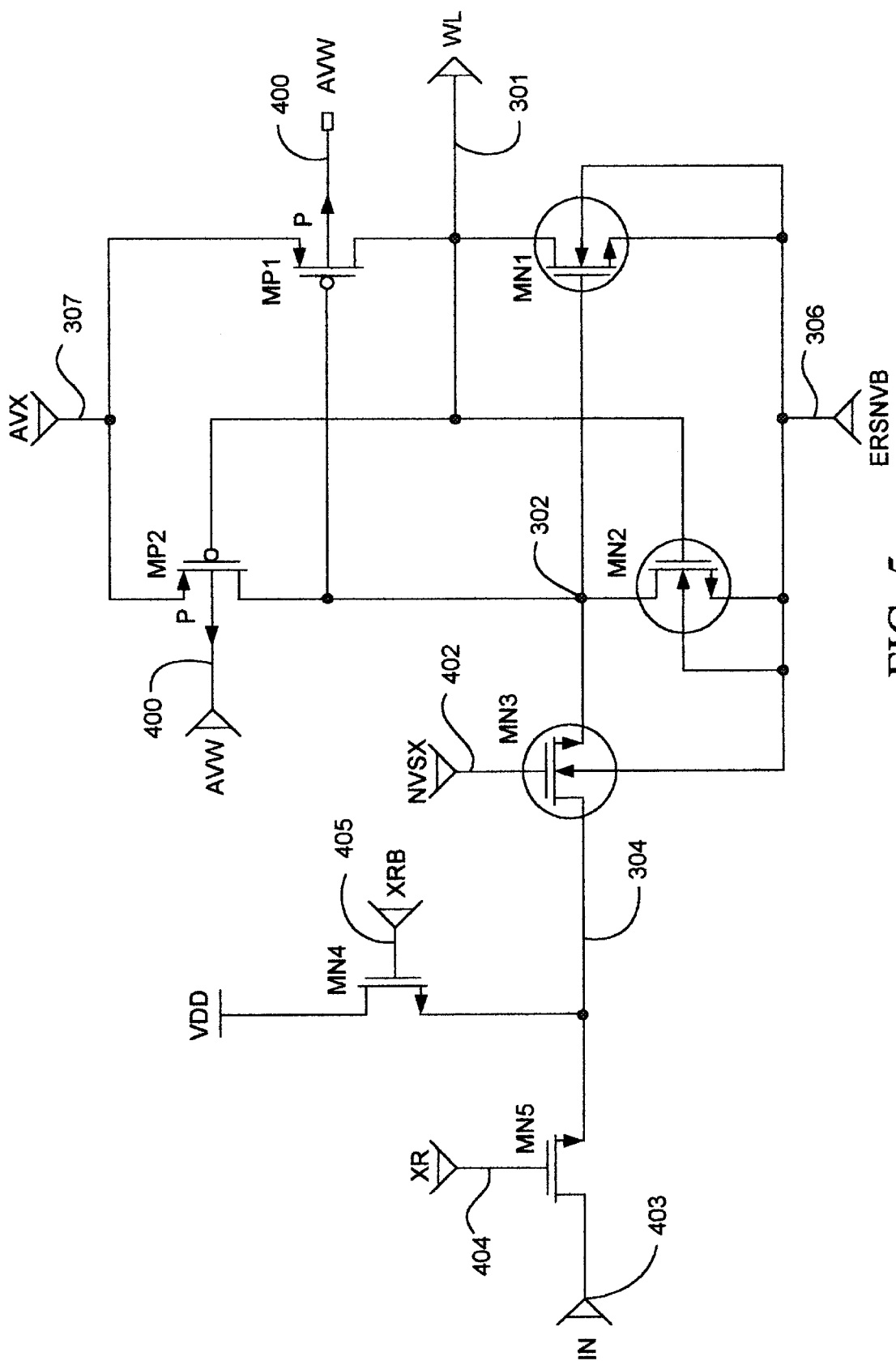
FIG. 5 illustrates an electrical schematic diagram of a wordline driver representing an embodiment of the present invention.

FIG. 5 provides an electrical schematic diagram of the wordline driver shown schematically in FIG. 3. The nodes AVX 307, ERSNVB 306, the decode input 304, and the wordline 310 are given the same reference numbers, as are used in FIG. 3. The inverter 300 of FIG. 3 is implemented by transistors MP1 and MN1. Transistor MP1 is a p-channel transistor 45 microns wide and 1.2 microns long. It is formed in an n-well which is biased by the voltage AVW on line 400. The n-channel transistor MN1 is implemented as shown above with respect to FIG. 4, with its isolated p-well coupled to its source and to the terminal ERSNVB on line 306. The n-channel transistor MN1 is 55 microns wide and 1.2 microns long.

The gates of transistors MP1 and MN1 are connected to node 302. Node 302 is connected to the source of isolation transistor MN3. The drain of isolation transistor MN3 is connected to node 304. The gate of isolation transistor MN3 is the NVSX signal on line 402. The isolation transistor MN3 is 20 microns wide and 1.2 microns long.

The p-channel transistor MP2 is formed in an n-well which is biased at the level AVW on line 400. The source of MP2 is connected to node 307 to receive the value AVX. The drain is connected to node 302. The n-channel transistor MN2 has its drain connected to node 302, its source connected to node 306, and its gate connected to line 301.

Similarly, the gate of transistor MP2 is connected to line 301. The isolated p-well of transistor MN2 is connected to node 306. Transistor MP2 is 3 microns wide and 4 microns long. Also, transistor MN2 is 3 microns wide and 4 microns long.

The wordline select signal on line 304 is generated in response to the signal IN on line 403, and the decode signals XR on line 404 and XRB on line 405. The signal IN on line 403 is connected to the drain of n-channel transistor MN5 which is 20 microns wide and 1.0 microns long. The source of transistor MN5 is connected to node 304. The gate of transistor MN5 is connected to line 404 to receive decode signal XR.

The XRB signal on line 405 is connected to the gate of n-channel transistor MN4. The drain of transistor MN4 is connected to the supply voltage $V_{DD}$. The source of transistor MN4 is connected to node 304. Transistor MN4 is 10 microns wide and 1.0 microns long. These n-channel transistors are not formed in isolated p-wells, because they are protected from negative voltages by the isolation transistor MN3.

Figure 6:
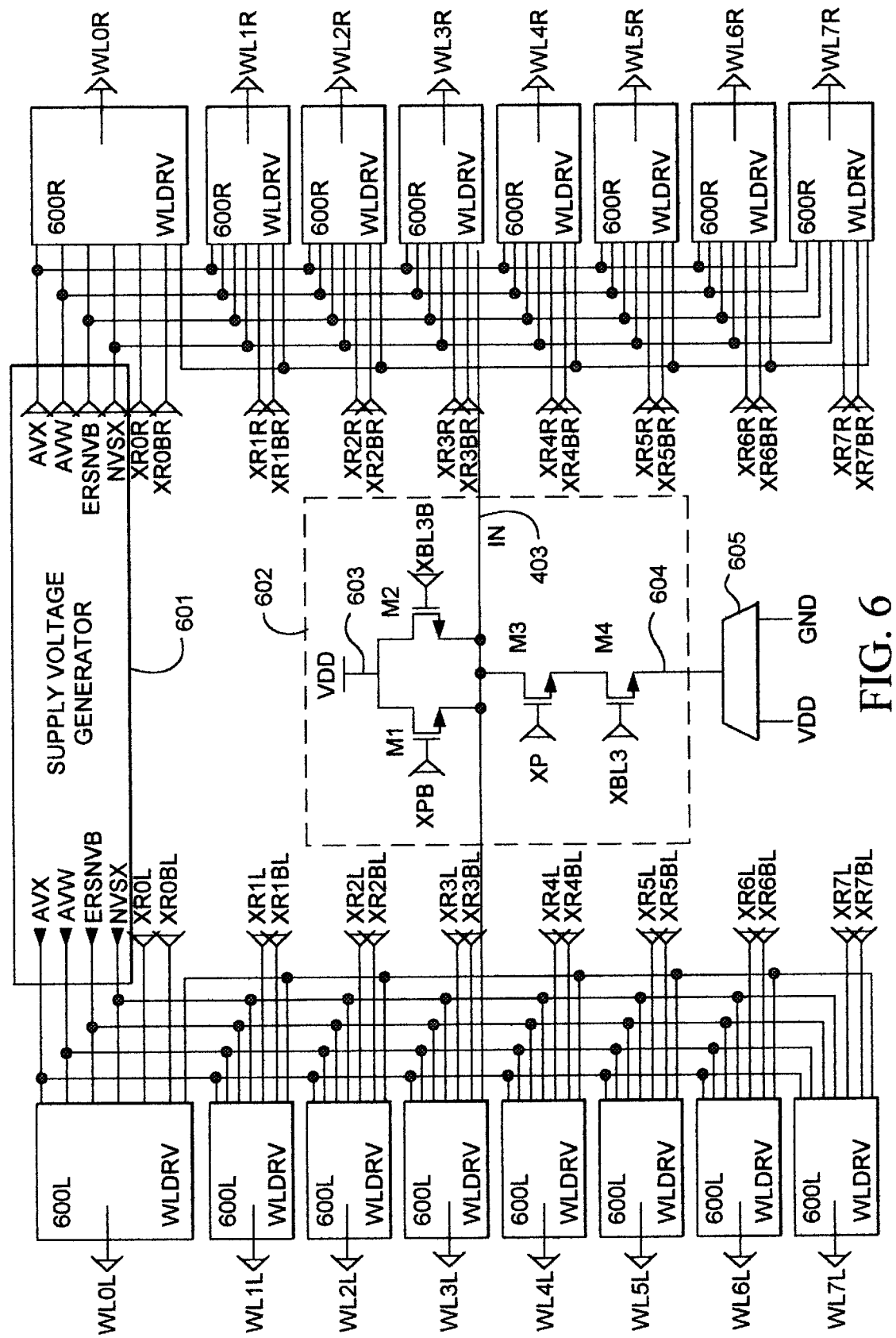
FIG. 6 illustrates an electrical schematic diagram of a decoder having a positive voltage mode and a negative voltage mode for use with the wordline driver of FIG. 5.

FIG. 6 illustrates the circuitry for generating the signal IN on line 403. In FIG. 6, an array of wordline drivers such as shown in FIG. 5 are illustrated. Each wordline driver is given reference number 600L or 600R for the left and right sides respectively. The left and right sides drive the same wordline. The reference of voltages AVX, AVW, ERSNVB, and NVSX are supplied by the supply selector circuitry schematically represented by box 601. An address decoder described below generates the signals XR(N)R for the right side drivers, and XR(N)L for the left side drivers, and complement signals XR(N)BR and XR(N)BL.

The IN signal is supplied on line 403 by the select circuitry, generally 602. The circuitry 602 has a first supply node 603 coupled to the supply $V_{DD}$, and a second supply node 604 coupled to a selector 605 which supplies either $V_{DD}$ or ground depending on the mode of operation. In the read and program mode (positive decode mode), node 604 is ground. In the erase mode (negative decode mode), node 604 is coupled to the supply voltage $V_{DD}$.

The circuitry 602 consists of an all n-channel NAND gate structure having transistor M1 and transistor M2 coupled in parallel between node 603 and line 403. The transistors M3 and M4 are connected in series between node 403 and node 604. The gate of transistor M1 is coupled to the decode signal XPB. The gate of transistor M2 is coupled to the decode signal XBL3B. The gate of transistor M3 is connected to the decode signal XP and the gate of transistor M4 is connected to the decode signal XBL3. Transistors M1 through M4 are all n-channel transistors 20 microns wide and 0.8 microns long.

XP and XPB are normally true and complement versions of the same signal. Similarly, XBL3 and XBL3B are true and complement versions of the same signal. Thus, when both XP and XBL3 are high, node 403 is coupled to node 604. Transistors M1 and M2 are off. When XP and XBL3 are low, node 403 is coupled to node 603, and transistors M3 and M4 are off. XP-XPB, XBL3-XBL3B and XR(N)L/R-XR(N)LB/RB (which are normally true and complement versions of the same signals) can also be operated to control of the wordlines by forcing XPB, XBL3B and XR(N)LB/RB to ground and decoding XP, XBL3, and XR(N)L/R in various modes as mentioned below.

The wordline drivers 600 operate in three modes:

a. "READ"

In the read mode, the decoder applies a positive voltage, setting a selected wordline to $V_{DD}$. Only one wordline is selected to AVX which is set at $V_{cc}$. The other wordlines are set at ERSNVB which is set at ground. At this state, the signals XP and XPB, XBL3 and XBL3B, and XR and XRB are the true and complement versions of the same signals. The line 604 is selected to ground in this state.

b. "PROGRAM"

In the program mode, the decoder applies a positive voltage to selected to wordlines at the high program voltage level.

c. "ERASE"

In erase mode, the decoder applies a negative voltage to a selected wordline, where the negative is the high negative voltage generated at ERSNVB. Thus, a selected wordline is connected to ERSNVB, while all others are coupled to AVX. The erase sequence is as follows:

In the wordline set mode WLSET, all the wordlines are set to high read voltage $V_{DD}$. To do this, XPB, XBL3B, and XR(N)LB/RB are grounded, the signal AVX is set at 5 V, AVW is set at 5 V, ERSNVB is set at 0 V, and a state machine controls the signals XP and XBL3 to sequentially flip the wordlines in the array to the positive value by applying ground to the IN node 403, and holding the XR value high.

Next, a wordline select step occurs, in which line 604 of FIG. 6 is set to $V_{DD}$, and the signals XR, XP, and XBL3 are decoded to connect one wordline driver to the ERSNVB voltage. Thus, a supply shift step is executed, which shifts the supply voltage AVX from +5 V to 0 V, and the supply voltage ERSNVB from 0, to −8 V. This shift is executed in a number of steps.

Finally, an erase sequence is executed, in which the voltage AVX is 0 V, the voltage AVW is 3 V, and the ERSNVB voltage is −8 V on a selected wordline.

During the read and program modes, the NAND gate circuitry 602 operates normally in response to the true and complement versions of the signals XP and XBL3 with ground connected at node 604. Thus, a selected wordline (XR high) will receive a low voltage on line 403 which will be passed by transistor MN5 and transistor MN3 of FIG. 5 to node 302. The inverter composed of transistors MP1 and MN1 will drive a high voltage, (AVX) on the wordline 301. A deselected wordline in the read or program modes will receive a high voltage on line 403 (or have XR low). Thus a high voltage will be passed to node 302 and inverted by transistors MP1 and MN1 to supply a low voltage on line 301.

During an erase mode in which selected wordlines are to receive a negative voltage from node 306, the polarity of the decode input signal on line 403 must be reversed. That is, a high value on node 403 will correspond to a selected wordline, while a low value on node 403 will correspond to a deselected wordline. To accomplish this function, the selector 605 is operated to supply $V_{DD}$ to node 604 during the erase mode, and the decode signals XPB, XBL3B, and XRB are clamped to ground. In this way as can be seen with reference to FIG. 6, node 603 is decoupled from node 403 during erase. In order to pull node 403 up, the signals XP and XBL3 must be high. When they are high, $V_{DD}$ is supplied from selector 602 to node 604 and on to node 403. When XP or XBL3 are low, then $V_{DD}$ is not coupled to node 403, and node 403 floats. Similarly, the signal XRB will be low, turning off transistor MN4, and preventing a pileup from node 304 to $V_{DD}$. The selected wordline will pass a high value through transistor MN5 in response to the signal XR, pulling up node 302, and supplying the negative voltage ERSNVB from node 306 to the wordline 301. The deselected wordline will be connected to AVX. Thus, care must be taken to ensure that node 302 is pulled down, unless a positive voltage is applied to node 304. This is accomplished by a careful sequence of operation described below. Thus, a two state decoder is used, for which a selected line is supplied a high value on line 304, in the first state (negative voltage decode), and the selected line is supplied a low value on node 304 in the second state (positive voltage decode).

Referring now to FIGS. 5 and 6, the basic operation of the circuit will be described. An erase bias is provided when the wordline driver is set to an negative high voltage (WLDRV= negative HV) and the p-well 405 or ARVSS is set to a positive high voltage (PWELL or ARVSS=positive HV). Erasure can be suppressed by setting the WLDRV level less negative, or to 0, or to a positive voltage.

The wordline WL can be set to AVX by a wordline set WLSET algorithm. In this algorithm, the first step is to set NVSX=$V_{CC}$; XR/XP/XBL3=decode; XRB/XPB/XBL3B= 0; and RESFG=0. The second step is to set NVSX=0.

The wordline WL can be set to ERSNVB by a wordline reset WL RES algorithm. In this algorithm, the first step is to set NVSX=$V_{CC}$; XR/XP/XBL3=decode; XRB/XPB/ XBL3B=0; and RESFG=$V_{CC}$. The second step is to set NVSX=0.

The wordline WL can also be set to ERSNVB by a wordline select WL SEL algorithm. In this algorithm, the first step is to set NVSX=$V_{CC}$; XR/XP7/XBL3=decode; XRB/XPB/XBL3B=0; and RESFG=$V_{CC}$. The second step of this algorithm is to set NVSX=0.

In the wordline level erase verify subroutine, the first step is to set 1WLDRV decode to AVX (erase verify wordline level) and verify. The second step is to set pass/fail information on the wordline flag (WLFLAG) responding to the erase verify result on that wordline (WL). The third step, which occurs after the entire sector is verified, is to set WL to AVX/ERSNVB depending on the WLFLAG (wordline flag) content. The wordline is set to AVX if the erase verify is passed. The WL is set to ERSNVB if the erase verify EV fails. The flag for the corresponding block (SECTOR FLAG) is reset only if all wordlines are verified pass on that sector.

The fourth step is to skip to step number 1 for the next sector if the sector flag is reset. The algorithm skips to step number 5 if the sector flags are reset or if a maximum allowed retry count is exceeded. Otherwise, the algorithm skips to an erase operation described below. Again, all the wordline drives are properly set to AVX/ERSNVB depending on the erase verification result.

The fifth step is to reset all the wordline drivers to ERSNVB. This represents the end of the erase verify mode.

The erase mode will now be described in more detail. The first step is to bring ERSNVB to negative high voltage and then proceed with the rest of the erase operation. Only those wordlines in which a re-erase operation is to be carried out are set to the negative high voltage. Those wordlines in which no re-erase operation is to be carried out can be set to a positive voltage.

The second step is to allow ERSNVB to recover to ground (0 volts).

The third step is to use WLRES to bring all wordlines to ERSNVB level. The fourth step, and the conclusion of the erase operation is to skip to the erase verify operation.

Figure 7A:
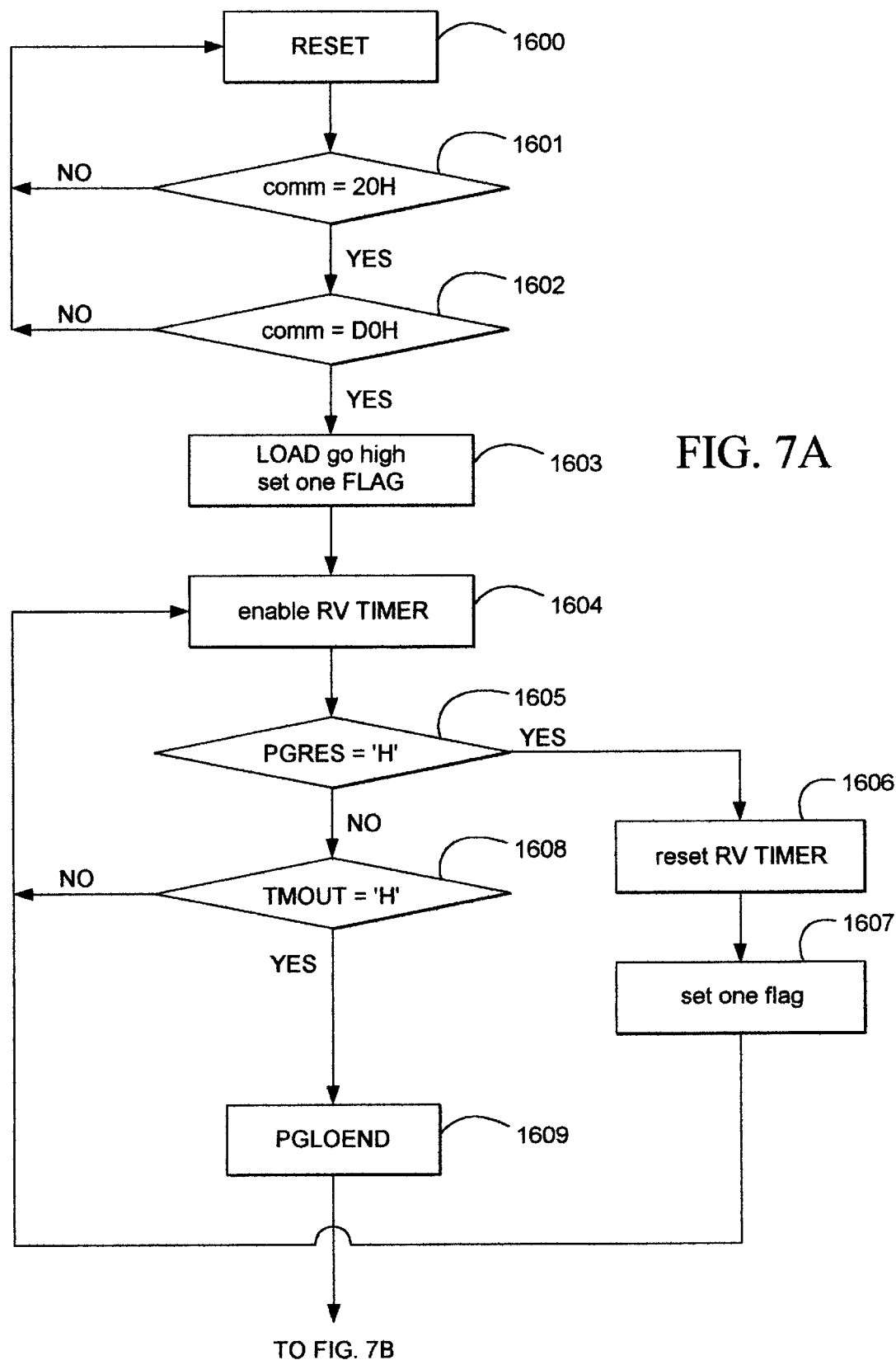
FIGS. 7A–7C illustrate a flow chart for an embedded erase operation with wordline level retry representing an embodiment of the present invention.
Figure 7B:
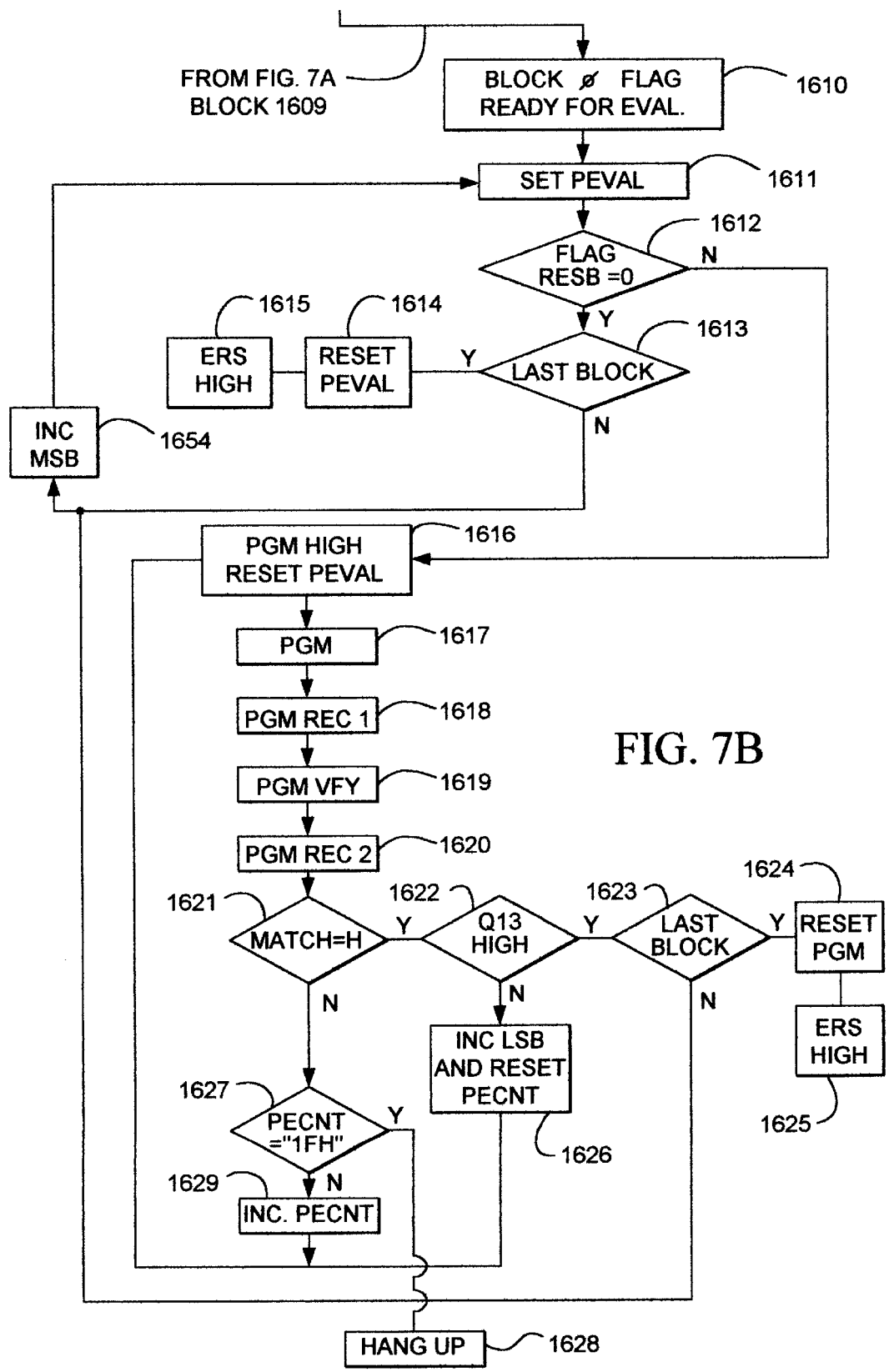
Figure 7C:
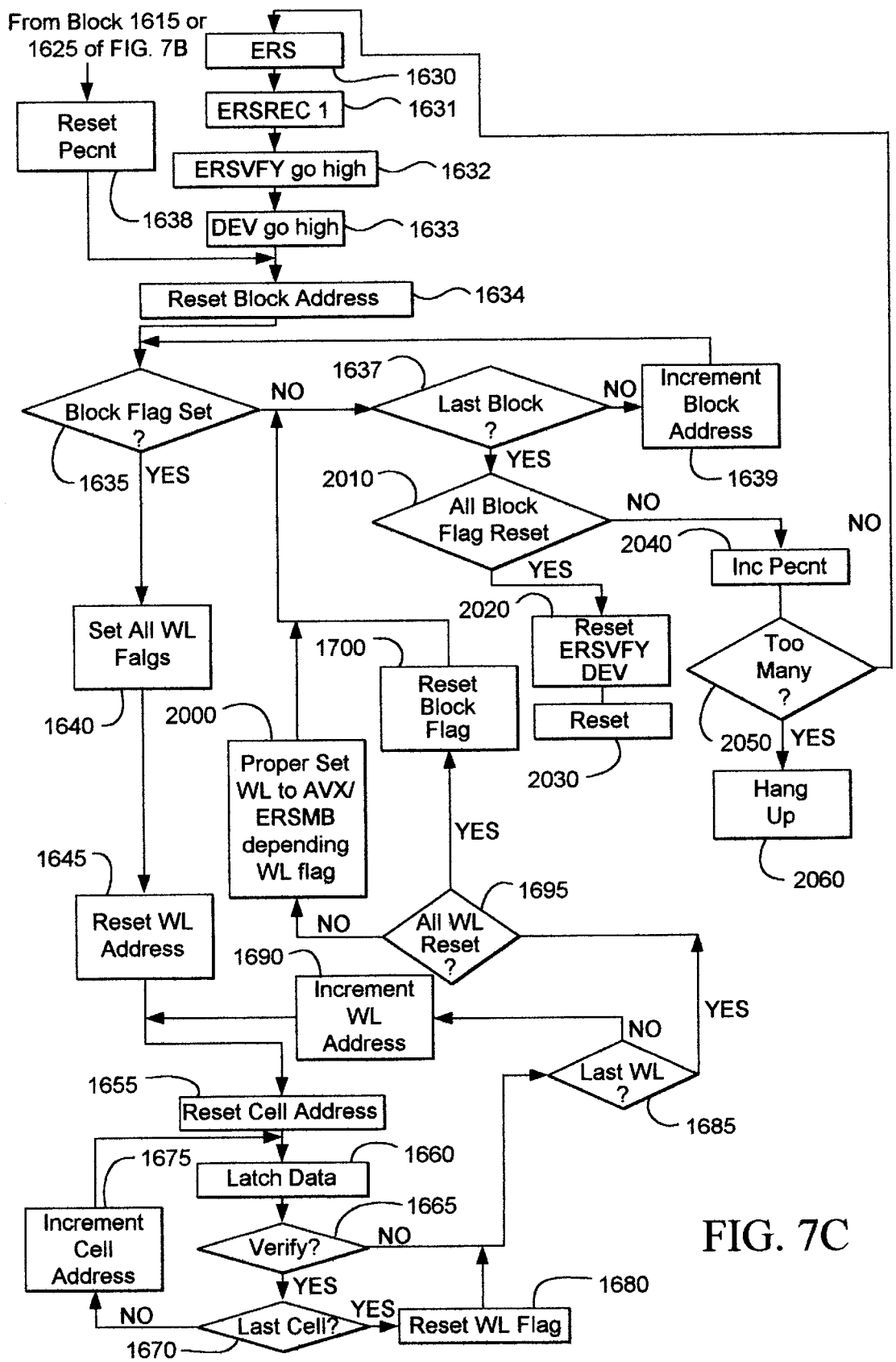

FIGS. 7A–7C provide a detailed flow chart for the embedded sector erase operation according to the present invention, with block level pre-programming and erasing, together with wordline level verification and re-erase. The algorithm begins with a loop including steps 1600, 1601, and 1602 in FIG. 7A waiting for a command consisting of (for example) a sequence of a 20(hex) followed by a D0(hex) on the input. Thus, the loop includes a reset step 1600, which proceeds to a test for 20(hex) (step 1601). If the test fails, the algorithm loops back to the reset step 1600. If the test is successful, then the algorithm tests for a D0(hex) in step 1602. If the test for D0(hex) fails, then the algorithm loops back to the reset step 1600. If a sequence of a 20(hex) word followed by a D0(hex) word is detected at step 1602, then the algorithm goes to step 1603 to assert the LOAD signal. This results in setting one of the 32 block flags in response to a decode of the incoming address. At this point, a timer is enabled in step 1604. Next, the algorithm tests for assertion of the PGRES signal, which indicates that the chip enable goes low during assertion of output enable to signal that the chip should latch another address and set another block flag. If the signal is high, then the algorithm loops to step 1606 to reset the RV timer, then a flag is set in response to the input address (step 1607). At that point, the algorithm loops back to the step 1604 to enable the RV timer.

If the PGRES signal is not high at step 1605, then the algorithm tests for expiration of the RV timer (step 1608). In the preferred system, this is about 100 microseconds. If the timer has not expired, then the algorithm loops to step 1604. If the timer has expired, then the PGLOEND signal is asserted at step 1609 indicating the ending of the sector address load sequence for latching the blocks to be erased. After step 1609, the algorithm loops to FIG. 7B.

In FIG. 7B, the algorithm begins after the set PGLOEND signal in step 1609 of FIG. 7A. The flag for block zero is ready for evaluation (step 1610) and the PEVAL is set to indicate the pre-programming flag evaluation interval of the erase mode (step 1611).

After the setting of PEVAL, the FLAGRESB signal is evaluated in step 1612. If the signal is zero, indicating a flag that is not set (i.e., the block in question is not to be erased), then the algorithm determines whether the last block has been evaluated in step 1613. If the last block has been evaluated, then the PEVAL signal is reset in step 1614 and the ERS signal is set high in step 1615. If at step 1613, the last block had not been evaluated, then the MSB counter is incremented in step 1654 and the algorithm loops back to step 1611 to evaluate the balance of the blocks having set flags.

Referring to FIG. 1, the FLAGRESB signal is generated by the block erase flags 130 for the current flag indicated by a signal from flags 130 in FIG. 1.

Referring again to FIG. 7B, if at step 1612, the FLAGRESB was not zero, indicating a set flag (i.e., the block in question is to be erased), then the algorithm loops to step 1616. At step 1616, the PGM signal is set high and the PEVAL signal is reset. This results in supplying the programming potentials to the bitlines, wordlines, and virtual ground terminals in the block to be erased. In one embodiment, four wordlines in respective sectors of the memory are enabled in parallel so that four bytes are pre-programmed in parallel.

After enabling the programming voltages as indicated by step 1617, a timer PGM/REC/1 is enabled to wait for program voltage recovery (step 1618). After step 1618, program verify voltages are driven (step 1619). A second verify timer is enabled for program verify voltage recovery in step 1620.

After expiration of the timer in step 1620, the logic determines whether the output of the comparator that tests the cells energized during step 1619 is high (step 1621). If it is high, then the algorithm tests whether Q13 is high in step 1621, which indicates that the least significant address counter has overflowed. In the embodiment of pre-programming four bytes in parallel, when the two least significant bits (Q12, Q13) are masked, the algorithm tests for Q11, which indicates counter overflow for four byte increments. If it has overflowed, then the algorithm determines whether the last block has been verified (step 1623). If the last block has been verified, then PGM is reset in step 1624 and the ERS signal is set high in step 1625.

If at step 1623, the last block had not been programmed, then the algorithm loops to step 1614 to increment the MSB counter and proceed to the next block having a set flag.

If at step 1622, the Q13 (or Q11) value had not overflowed, then the least significant bit counter is incremented by one (or by four when testing on Q11) and the PECNT signal is reset (step 1626). Next, the algorithm loops to step 1617 to continue programming the block. The PECNT signal is a retry counter which is incremented in the event the match signal at step 1621 was not high. Thus, if after step 1621 the match signal is not high, the algorithm tests whether the retry counter PECNT has overflowed (block 1627).

If it is determined to have overflowed, then an error is indicated and the algorithm hangs up (step 1628). If the counter has not overflowed then it is incremented in step 1629 and the algorithm loops back to step 1617.

As indicated with respect to FIG. 7B, when the last block has been successfully preprogrammed, the ERS signal is set high, either at step 1615 or step 1625. After the setting of ERS high, the algorithm loops to the procedure illustrated in FIG. 7C.

As shown in FIG. 7C, the first step is to reset a re-erase/reverify attempt counter (PECNT) at step 1638. The word-line level verification and re-erase sequence begins by resetting a block address counter to zero (step 1634). At step 1635 the block flag of the block identified by the block address is polled to determine whether it is set. If the block flag is not set, the algorithm determines whether the block address counter is at the last block (step 1637). If the block address counter is not at the last block, the block address is incremented at step 1639 and the algorithm loops back to step 1635. If, on the other hand, the block address counter is at the last block, then the algorithm determines whether all block flags are set at step 2010. If the all the block flags have been reset, then the algorithm resets ERSVFY and DEV at step 2020 and the algorithm then resets at step 2030. If at step 2010 it is determined that not all of the block flags bS have been reset, then the algorithm increments the counter PECNT at step 2040. The algorithm then determines whether the counter PECNT has exceeded a threshold at step 2050. If the threshold has been exceeded by the counter percent then the algorithm terminates at step 2060. On the other hand, if the threshold has not been exceeded by the counter PECNT, then the algorithm loops to step 1630. The algorithm applies the proper erase voltages to the blocks to be erased as controlled to the sources through the bottom block select transistor BBSEL and to the wordlines in an array as shown in FIG. 2 (step 1630). After the erase operation, an erase recovery timer is used to allow for recovery of the erase voltages (step 1631). After recovery in step 1631, the ERSVFY signal goes high (step 1632). Next, the delayed erase verify signal DEV goes high (step 1633).

Referring again to step 1635, if a particular block flag is set then all the shared wordline flags are reset at step 1640.

A wordline address counter is reset at step 1645. Then a cell address counter is reset at step 1655. The algorithm then commences an erase verification sequence within the given wordline. Erase verification data for the cells in question (one or more cells at a time) is obtained in step 1660. The data obtained in step 1660 is then compared at step 1665 to determine whether the cell(s) in question are properly erased. If erase verification passes for the cell(s) in question, the algorithm determines whether the address counter is at the last cell (step 1670). If the last cell has not been reached, the cell address counter is incremented at step 1675, and the algorithm loops back to step 1660. If, on the other hand, the cell address counter is at the last cell, the wordline flag corresponding to the wordline in which that cell resides is reset in step 1680 and the algorithm goes to step 1685.

However, if the data obtained in step 1660 is not determined by comparison to be equivalent to an erase verification pass, then the algorithm directly determines whether the wordline being verified is the last wordline in that sector at step 1685. If the current wordline is not the last wordline in that sector, then the wordline address counter is incremented in step 1690 and the algorithm loops to step 1655.

On the other hand, if it is determined at step 1685 that the wordline counter is at the last wordline for that sector, then the algorithm determines at step 1695 whether all the wordline flags have been reset. If all the wordline flags have been reset, then the algorithm resets the block flag corresponding to the block composed by the wordlines that have just been verified as being erased (step 1700). The algorithm then goes to step 1637.

However, if at step 1695 it is determined that not all of the wordline flags have been reset, then the algorithm properly sets WL to AVX/ERSNVB depending on the WL flag at step 2000. The algorithm then goes to step 1637.

Figure 8:
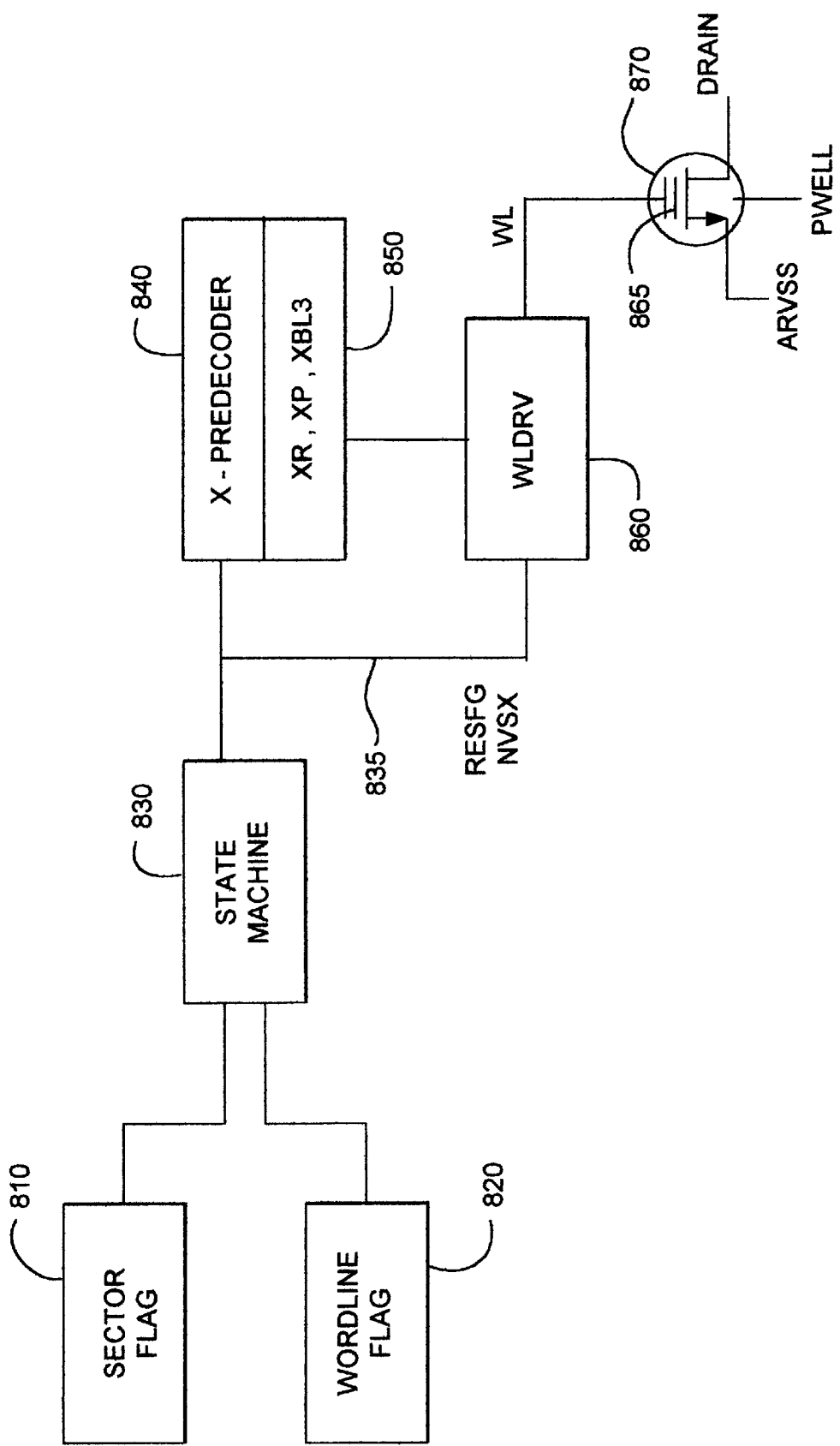
FIG. 8 illustrates a block schematic diagram of a system representing an embodiment of the invention.

Referring to FIG. 8, an embodiment of the invention is depicted as a state machine 830. The state machine 830 is connected to a sector flag 810 and a wordline flag 820. The state machine 830 is also connected to an X-predecoder 840. The X-predecoder 840 is connected to circuitry for transmitting state variables XR, XP, XBL3 850. Thus, the state machine 830 generates a signal along line 835 (i.e., RESFG or NVSX). The signal along 835 is fed to wordline driver 860. Wordline driver 860 then sends a signal to the floating gate 865 of floating gate transistor 870.

Thus, the present invention provides a FLASH EPROM integrated circuit including an over-erase protection scheme to free wordline which pass erase verify from being erased again. In a preferred system, a block which is a unit for the block erase mode is composed of 128 Kilobits. The system is divided into 32 blocks for 4 Megabits. A flag is associated with each block to indicate the erase status. If the flag is set, then for that particular block, the block is erased and then erase verify operations go through every address. If the flag is off or reset for a given block, then the internal state machine skips the block without doing any operation.

In a preferred system, a wordline which is a unit for the wordline re-erase mode and over-erase protection is composed of two kilobits. Each block in such a system is divided into 64 wordlines. A flag is associated with each wordline of the block currently being verified. If a wordline flag is set, then for that particular wordline in that particular block, the entire wordline is re-erased and then reverification operations go through every address. If the flag is off or reset for a given wordline, then the internal state machine skips the block, thereby increasing the overall erasure speed and protecting of cells of that wordline from overerasure.

The block flags are set at the beginning by the user. The user is able to select from 1 to 32 blocks for the erase operation. After the block flags are set, the state machine goes to the erase stage, and the blocks with flags on are erased at the same time. Then the state machine starts erase verify from block 0. Before verification is performed, the block skipping control circuitry evaluates the corresponding block flag first. For every block having a set flag, each address will then be verified within the wordline level protocol.

If a byte fails to verify, the flag remains on and the state machine will skip the wordline and move to the next wordline. After the state machine verifies all the wordlines of the current block correctly, the flag will be turned off or reset. This indicates that the particular block has passed the erase verification process and will become over-erase protected.

The state machine repeats the sequence for each wordline within a selected block until all wordlines in that block have been processed. Then the state machine checks the wordline flag status again to insure that all wordline flags have been reset. The wordline flag is used to properly set WL to AVX/ERSNVB. Then, the algorithm skips to another block.

Accordingly, a wordline level erase scheme is provided with over-erase protection, and which is very efficient by skipping verification of wordlines that need not be re-verified or have not been subject of the operation. The system is particularly suited to FLASH EPROM integrated circuits as described above. However, it may be equally applied to other EEPROM type systems which may be subject to over-erase problems.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method of erasing a floating gate memory array that includes a plurality of blocks of floating gate memory cells, each of the plurality of blocks including a plurality of wordlines of floating gate memory cells, the method comprising:

applying energizing voltages to at least one of the plurality of blocks to erase the at least one of the plurality of blocks;

verifying erasure of individual wordlines in the plurality of wordlines that compose the at least one of the plurality of blocks; and re-erasing individual wordlines that fail erase verify, wherein re-erasing individual wordlines yields improved threshold voltage control of the floating gate memory cells over re-erasing blocks.

2. The method of claim 1, further comprising:

receiving erase commands and setting at least one of a plurality of block erase flags in response to the erase commands, the at least one of the plurality of block erase flags corresponding to the at least one of the plurality of blocks floating gate memory cells to be erased, and wherein the step of verifying includes i) setting all of a plurality of shared wordline erase flags corresponding to respective wordlines in the at least one of the plurality of blocks, ii) and resetting individual shared wordline erase flags among the plurality of shared wordline erase flags to indicate which of the plurality of shared wordlines pass the step of verifying.

3. The method of claim 2, wherein i) the step of receiving includes receiving erase commands that designate a selected group of blocks to be erased from among the plurality of blocks, and ii) the step of applying includes applying energizing voltages to the selected group of the plurality of blocks to erase the selected group of the plurality of blocks, and iii) the step of verifying includes verifying erasure of individual wordlines in the plurality of wordlines that compose the selected group of blocks, one block at a time.

4. The method of claim 2, wherein one or more of the individual shared wordline erase flags includes a latch in a wordline driver coupled to the floating gate memory array.

5. The method of claim 1, wherein the step of re-erasing includes re-erasing at least one of the individual wordlines with energy from one or more latches in one or more wordline drivers coupled to the at least one of the individual wordlines.

6. An apparatus for storing data, comprising:
   a memory array including a plurality of blocks of floating gate memory cells, each of the plurality of blocks including a plurality of wordlines of floating memory cells;
   energizing power supply circuits, coupled with the memory array, to apply energizing voltages to the plurality of blocks of memory cells to read and program addressed memory cells in the memory array and erase at least one of the plurality of blocks;
   erase verify logic, coupled with the memory array, to separately verify erasure of individual wordlines in the plurality of wordlines that compose the at least one of the plurality of blocks; and
   control circuits, coupled with the energizing power supply circuits and the erase verify logic, to control the energizing power supply circuits and wherein:
   the control circuits further include i) a plurality of block erase flags corresponding to respective blocks in the plurality of blocks and ii) a plurality of shared wordline erase flags corresponding to respective wordlines in each of the plurality of blocks, the plurality of shared wordline erase flags being shared by each of the plurality of blocks; and
   the erase verify logic further includes a circuit responsive to the plurality of shared wordline erase flags to separately verify erasure of individual wordlines indicated by the plurality of shared wordline erase flags.

7. The apparatus of claim 6, wherein the control circuits include a control input to receive erase commands; and a state machine and wherein:
   the state machine is responsive to the erase commands to erase a first block from among the plurality of blocks, said first block being indicated by the erase commands,
   set all the shared wordline erase flags, then
   separately verify the erasure of each individual wordline from among the plurality of wordlines composed by the first block; and
   separately reset the shared wordline erase flags corresponding to each individual wordline that passes verification.

8. The apparatus of claim 6, wherein the energizing power supply circuits erase a group of selected blocks among the plurality of blocks of memory cells; and
   the control circuits i) include a control input to receive erase commands indicating the group of selected blocks, and ii) control the energizing power supply circuits to erase the group of selected blocks.

9. The apparatus of claim 6, wherein the erase verify logic includes logic to set the block erase flags corresponding to respective blocks in the group of selected blocks.

10. The apparatus of claim 9, wherein the erase verify logic includes logic to reset the shared wordline erase flags for individual wordlines that pass erase verify.

11. The apparatus of claim 6, wherein i) the control circuits include a control input to receive erase commands indicating a group of selected blocks from among the plurality of blocks of memory cells, ii) the erase verify logic includes logic to set the block erase flags corresponding to the group of selected blocks, iii) the erase verify logic includes logic to set all of the plurality of shared wordline erase flags so as to flag the plurality of wordlines that compose a first block of memory cells to be erased, iv) the control circuits control the energizing power supply circuits to erase the first block of memory cells, v) the erase verify logic includes logic to reset the shared wordline erase flags for individual wordlines of memory cells that pass erase verify, and vi) the control circuits include a state machine, responsive to the plurality of shared wordline erase flags, to control erasing of individual wordlines of memory cells indicated by the shared wordline erase flags.

12. The apparatus of claim 11, wherein i) the erase verify logic includes logic to set all of the plurality of shared wordline erase flags so as to flag the plurality of wordlines that compose a second block of memory cells to be erased, ii) the control circuits control the energizing power supply circuits to erase the second block of memory cells, iii) the erase verify logic includes logic to reset the shared wordline erase flags for individual wordlines of memory cells that pass erase verify, and iv) the control circuits include a state machine, responsive to the plurality of shared wordline erase flags, to control erasing of individual wordlines of memory cells indicated by the shared wordline erase flags.

13. The apparatus of claim 6, wherein the plurality of blocks of floating gate memory cells include FLASH EPROM memory cells.

14. The apparatus of claim 6, wherein one or more of the plurality of shared wordline erase flags includes a latch in a wordline driver coupled to the memory array.

15. The apparatus of claim 6, further comprising a plurality of wordline drivers coupled to the memory array, and each of the plurality of wordline drivers including a latch, and the latch adapted to provide energy for re-erasing a wordline that fails erase verify.

16. A FLASH EPROM integrated circuit, comprising:
   a memory array including a plurality of blocks of FLASH EPROM memory cells, each of said plurality of blocks of FLASH EPROM memory cells including a plurality of wordlines of FLASH EPROM memory cells;
   a plurality of block erase flags corresponding to respective blocks in the plurality of blocks of FLASH EPROM memory cells;
   a plurality of shared wordline erase flags corresponding to respective wordlines in the plurality of wordlines of FLASH EPROM memory cells;
   command logic, coupled to command inputs, to set the shared wordline erase flags corresponding to wordlines to be erased;

energizing power supply circuits, coupled with the memory array, to apply energizing voltages to read and program addressed memory cells in the memory array and to erase wordlines in the memory array;

erase verify logic coupled with the memory array, for i) separately verifying erasure of wordlines in the plurality of blocks of FLASH EPROM memory cells and ii) resetting the shared wordline erase flags of wordlines which pass erase verify; and control circuits coupled with the plurality of shared wordline erase flags, the energizing power supply circuits, and the erase verify logic to control the energizing power supply circuits so as to erase wordlines having the shared wordline erase flags set and wherein:

the erase verify logic further includes a circuit responsive to the plurality of shared wordline erase flags, for verifying erasure of only wordlines having the shared wordline erase flags set.

17. The FLASH EPROM integrated circuit of claim 16, wherein the erase verify logic includes: an address counter, coupled to the plurality of shared wordline erase flags, to address memory cells in wordlines having the shared wordline erase flags set;

a comparator, coupled to the memory array, to test data in the memory cells addressed by the address counter for successful erase; and logic to reset the shared wordline erase flag for a tested wordline of memory cells that is successfully erased.

18. The FLASH EPROM integrated circuit of claim 17, wherein the control circuits include a state machine, responsive to the plurality of shared wordline erase flags, to control erasing and verifying of wordlines of memory cells indicated by the shared wordline erase flags.

19. The FLASH EPROM integrated circuit of claim 16, wherein the control circuits include a state machine to execute an embedded erase operation, said state machine having i) a program mode, ii) a program verify mode, iii) an erase mode, and iv) an erase verify mode; and in the program mode controlling the energizing power supply circuits to program data;

in the program verify mode controlling the energizing power supply circuits to verify the programming of data programmed in the program mode;

in the erase mode controlling the energizing power supply circuits to erase blocks having the block erase flags set; and in the erase verify mode controlling the energizing power supply circuits to verify the erasing of blocks erased in the erase mode and to reset the block erase flags of blocks passing erase verify.

20. The FLASH EPROM integrated circuit of claim 19, wherein the state machine includes logic in the erase verify mode to sequentially process wordlines having the shared wordline erase flags set, and bytes in a particular wordline and if any particular byte in the particular wordline fails erase verify, then to proceed to a next wordline having a shared wordline erase flag set before completing verification without resetting the shared wordline erase flag for the particular wordline or if all bytes in the particular wordline pass erase verify, then to reset the shared wordline erase flag for the particular wordline and to proceed to a next wordline having a shared wordline erase flag set; and then return to the erase mode if all block erase flags have not been reset.

21. The FLASH EPROM integrated circuit of claim 16, wherein one or more of the plurality of shared wordline erase flags includes a latch in a wordline driver coupled to the memory array.

22. The FLASH EPROM integrated circuit of claim 16, further comprising a plurality of wordline drivers coupled to the memory array, and each of the plurality of wordline drivers including a latch, and the latch adapted to provide energy for re-erasing a wordline that fails erase verify.

23. An apparatus for storing data, comprising:

a memory array including a plurality of wordlines of FLASH EPROM memory cells;

energizing power supply circuits, coupled with the memory array, to a) apply energizing voltages to the plurality of wordlines of FLASH EPROM memory cells to read and program addressed memory cells in the memory array and b) erase at least one of the plurality of wordlines of FLASH EPROM memory cells;

erase verify logic, coupled with the memory array, to separately verify erasure of individual wordlines in the plurality of wordlines of FLASH EPROM memory cells; and control circuits, coupled to both the energizing power supply circuits and the erase verify logic, to control the energizing power supply circuits, and wherein:

the control circuits further include a plurality of wordline erase flags corresponding to respective wordlines in the plurality of wordlines of FLASH EPROM memory cells; and the erase verify logic further includes a circuit responsive to the plurality of wordline erase flags to verify erasure of wordlines indicated by the wordline erase flags.

* * * * *